(12) United States Patent
Rückl

(10) Patent No.: US 6,309,799 B1
(45) Date of Patent: Oct. 30, 2001

(54) PROCESS FOR PRODUCING A PRINTING FORM

(75) Inventor: Siegfried Rückl, Kufstein (AT)

(73) Assignee: Schablonentechnik Kufstein Aktiengesellschaft, Kufstein (AT)

(*) Notice: Subject to any disclaimer, the term of this patent is extended or adjusted under 35 U.S.C. 154(b) by 0 days.

(21) Appl. No.: 09/184,880

(22) Filed: Nov. 3, 1998

(30) Foreign Application Priority Data

Nov. 3, 1997 (EP) .................................................. 97119181

(51) Int. Cl.⁷ .......................... G03F 7/00; G03F 7/213; G03F 7/30; G03F 9/00; G03F 7/12
(52) U.S. Cl. ...................... 430/306; 430/273.1; 430/5; 430/308; 430/275.1; 430/322; 430/323; 430/324; 430/289.1; 430/927
(58) Field of Search .................... 430/306, 308, 430/273.1, 275.1, 5, 271.1, 322, 323, 324, 289.1, 927

(56) References Cited

U.S. PATENT DOCUMENTS

| | | | |
|---|---|---|---|
| 4,132,168 | * | 1/1979 | Peterson ........................ 101/471 |
| 4,842,987 | * | 6/1989 | Elzer et al. ...................... 430/281.1 |
| 5,024,919 | | 6/1991 | Yamauchi ........................ 430/273.1 |
| 5,055,379 | * | 10/1991 | Bagchi et al. .................... 430/271.1 |
| 5,262,275 | * | 11/1993 | Fan ................................... 430/306 |
| 5,360,694 | * | 11/1994 | Thien et al. ..................... 430/200 |

FOREIGN PATENT DOCUMENTS

| | | |
|---|---|---|
| A1 4203554 | 8/1993 | (DE) . |
| A1 4243750 | 6/1994 | (DE) . |
| A1 4339010 | 1/1995 | (DE) . |
| A1 19536806 | 3/1997 | (DE) . |
| A1 19536805 | 4/1997 | (DE) . |
| A1 0001030 | 3/1979 | (EP) . |
| A2 0065760 | 1/1982 | (EP) . |
| A2 0264845 | 4/1988 | (EP) . |
| A1 0785474 | 7/1997 | (EP) . |
| A2 0803772 | 10/1997 | (EP) . |

* cited by examiner

Primary Examiner—Janet Baxter
Assistant Examiner—Sin J. Lee
(74) Attorney, Agent, or Firm—Birch, Stewart, Kolasch & Birch, LLP

(57) ABSTRACT

The invention relates to a process for producing a printing form, in which a covering layer (5) is applied to a first radiation-sensitive layer (4) arranged on a carrier (1), the applied covering layer (5) is structured in accordance with a pattern to be printed, in order to form an irradiation mask (5'), and the radiation-sensitive layer (4) is irradiated and developed. In this way, in the production of printing forms, an irradiation mask (5') can be applied very precisely in accordance with a pattern to be printed later.

40 Claims, 8 Drawing Sheets

PROCESS FOR PRODUCING A PRINTING FORM

BACKGROUND OF THE INVENTION

FIELD OF THE INVENTION

The invention relates to a process for producing a printing form.

In the production of screen-printing stencils, it is known to apply a photosensitive resist (lacquer) to a screen serving as the carrier of the printing form or stencil, to expose it and subsequently to develop it, in order to remove the photoresist layer in regions in which later, during printing, ink is intended to be transferred through the screen. The exposure, as conditioned by the pattern, of the photoresist layer is in this case performed, for example, by means of a large film laid onto the printing form blank or point by point with the aid of laser light, the entire photoresist layer being scanned point by point and exposed only at those locations at which the chemical structure of the photoresist is intended to be changed, as conditioned by the pattern, for the later development. Furthermore, it is known to vaporize the photoresist layer away, in accordance with the pattern, using a $CO_2$ laser.

Both the use of large films and the use of lasers, in particular $CO_2$ lasers, which have a very high energy demand, makes the production of screen-printing stencils more expensive.

In the production of a flexographic printing form, a radiation-sensitive or photosensitive material, for example a photopolymer or photoelastomer is first applied to a carrier. Then, by means of irradiating or exposing individual regions of the layer, as conditioned by the pattern, the polymer is crosslinked. Ultraviolet radiation is preferably used for the exposure. Subsequently, in a suitable developer, the unexposed and hence noncrosslinked polymer regions are washed out. If appropriate, using a radiation source emitting in the UV range, the photopolymer layer is re-exposed and hence more intensively crosslinked.

In the case of the previously known methods, the regions of the radiation-sensitive layer that were not to be exposed in accordance with the pattern, that is to say in particular of the photoelastomer layer, are covered, either by a full-size film, as in the case of screen-printing stencils, or by means of a layer applied in the shape of the pattern by means of nozzles.

In the case of covering the radiation-sensitive layer with a photographically produced full-size film, a seam in the pattern in the case of cylindrical printing forms is generally impossible to avoid. In any case, such a full-size film usually which must have the size of the printing forme. Therefore, in the case of cylindrical printing formes the size of the cylinder surface, makes the production of printing formes considerably more expensive.

The spraying on process, in accordance with the pattern, of a covering, light-absorbing and/or light-reflecting ink layer with the aid of nozzles onto a radiation-sensitive layer places demands on highly-pure covering inks, which adhere adequately to the radiation-sensitive layer and nevertheless do not block up the nozzles used. In addition to the high requirements on the covering inks, the nozzles used for the spraying on process must also satisfy high requirements, since a large number of droplets of constant size have to be produced per unit time.

Although the problems which occur during the handling of large films may be avoided by spraying covering ink in accordance with the pattern onto the surface of a printing forme, in particular onto a cylinder surface, the spraying on technique requires very precise nozzles, which are complicated to produce and to control.

SUMMARY OF THE INVENTION

Taking this as the starting point, the invention is based on the object of providing a process for producing a printing forme which is simple and cost-effective to carry out and, in the process, delivers printing formes that are true to pattern.

According to the invention, therefore, in the production of printing formes, in particular in the production of cylindrical flexographic printing formes, a radiation-proof or light-proof covering layer is applied to a radiation-sensitive layer, in particular a photopolymer or photoelastomer layer. By means of a subsequent structuring of the covering layer in accordance with a pattern, an irradiation or exposure mask is constructed directly on the radiation-sensitive layer. The exposure and development of the radiation-sensitive layer is then subsequently performed in the usual way.

In the case of the process according to the invention, therefore, the exposure mask according to the pattern is constructed directly on the layer to be exposed, the layer to be exposed firstly being completely covered with the covering layer, in order then to structure the latter. In selecting the covering layer material, it is therefore necessary to take into account only the adhesion properties and the radiation absorption and radiation reflection properties. The absorption and/or reflection capability of the covering layer is in this case to be matched to the radiation sensitivity of the first radiation-sensitive layer. Although it is sufficient if the covering layer completely blocks off only the radiation used for the exposure of the first radiation-sensitive layer, it is advantageous if the covering layer also has a good absorption or reflection capacity even in the adjacent radiation regions.

The process according to the invention may be used not only in the case of the actual production of printing formes, in which the first radiation-sensitive layer is structured in accordance with a pattern to be printed later, but also in the production of screens formed by electrotyping. In this case, the first radiation-sensitive layer, which is arranged on a conductive full-area, in particular a metal surface, is then patterned in accordance with the screen to be produced by electroplating.

The process according to the invention may be simplified further if provision is made for the covering layer to be structured in accordance with the pattern, where the irradiation mask is removed during the development of the first radiation-sensitive layer with mechanical and/or chemical means. With this mechanical and/or chemical means, an additional processing step for the separate removal of the covering layer following the exposure, where such a step complicates the process unnecessarily, is avoided.

In the process according to the invention, provision is expediently made that, in order to structure the covering layer as conditioned by the pattern, parts to be removed of the covering layer are removed directly. In this case, it is possible for the parts to be removed from the covering layer, as conditioned by the pattern. The parts can be removed mechanically, but it is preferred to use radiation.

Any radiation that can be focused precisely to a point can be used as the radiation for removing the parts to be removed of the covering layer. It is thus, for example, conceivable to employ a particulate radiation, in particular electron beams. However, provision is preferably made for electromagnetic radiation, in particular heat radiation or light to be used as the radiation for the removal of the covering layer in accordance with the pattern. In this case, it is possible to use as the radiation source any suitable lamp which emits light or heat in the desired or required spectral range with an adequate intensity. However, it is particularly expedient if laser radiation is used as the radiation for the removal of the covering layer in accordance with the pattern. Laser radiation has the advantage that it is easily to construct and handle very small light spots of high intensity for the removal of the covering layer.

In the case of another refinement of the invention, provision is made for a structuring mask to be applied to the covering layer in accordance with the pattern, preferably to be sprayed on, in particular sprayed on point by point. For the uncovered parts of the covering layer to be removed, the structuring mask (6) is formed by means of a wax solution and the uncovered parts of the covering layer are removed chemically, preferably by etching.

The spraying of a covering liquid, in particular of a wax solution, onto the covering layer provided in order to form an irradiation mask has the advantage that the liquid to be sprayed on, for example, the wax solution, can be selected only. According to its later function as a structuring mask and its capability to adhere and ability to be sprayed on by means of nozzles. This liquid does not need to possess light-screening properties, with the result that it also does not have to contain any pigments or light-reflecting or light-absorbing particles that could impair the spraying on of the liquid by means of nozzles.

In the case of a particularly advantageous refinement of the invention, provision is made that, in order to structure the covering layer, a second radiation-sensitive layer is applied to the covering layer. The second layer is in such that the pattern and uncovered parts of the covering layer are removed. The parts of the covering layer to be removed expediently are removed during the development of the second radiation-sensitive layer.

This makes it possible to transfer the desired pattern firstly by means of a very precise exposure process to the second radiation-sensitive layer, and then in one operation, during the development of the radiation-sensitive layer, also to remove the covering layer as conditioned by the pattern and thus to structure it.

The radiation-sensitivity range of the second radiation-sensitive layer is different from that of the first radiation-sensitive layer. The use of photosensitive materials having different sensitivity ranges also makes it possible to use covering layers whose absorption and reflection capacity for the radiation used during the exposure of the second radiation-sensitive layer is relatively poor, since this radiation cannot crosslink the first photosensitive layer.

The use of a photoresist that is also sensitive to visible light radiation for the second radiation-sensitive layer makes it possible to select a light source suitable for the exposure from a large number of light sources that are available in this wavelength range. In this range, in particular, laser light sources are also available with which particularly precise exposure, true to pattern, may be achieved.

In the case of using photoresists, it is possible both for so-called negative resists, in which the resist is crosslinked by the radiation and hence hardened, and also positive resists, in which the intrinsically hard photoresist can be decomposed by the exposure, to be used. However, it is particularly advantageous to use a positive resist that can be decomposed by light, since here both the first exposure, the exposure of the second photosensitive layer, and the second exposure, the exposure of the first radiation-sensitive layer, are performed in the same regions, as conditioned by the pattern. This makes it possible to use even relatively simple covering layers, which block off the radiation used during the exposure of the first radiation-sensitive layer only incompletely, since in this case a pre-exposure of the first radiation-sensitive layer during the exposure of the second radiation-sensitive layer interferes hardly at all with the construction of the pattern, but rather promotes it.

Provision is expediently made that the second radiation-sensitive layer is 1 μm to 20 μm, preferably 7 μm to 14 μm, and in particular 10 μm, thick.

However, it is particularly advantageous if the radiation used during the irradiation or exposure of the second radiation-sensitive layer does not penetrate through the covering layer. In this way, the premature, undesired crosslinking of the first radiation-sensitive layer during the exposure of the second radiation-sensitive layer is prevented.

A printing forme or electroplate forme for carrier screens that is particularly true to pattern is obtained if provision is made that the irradiation of the covering layer in accordance with the pattern, or of the second radiation-sensitive layer, is performed point by point. In this case it is possible to shorten the time for the first exposure, the exposure of the second radiation-sensitive layer, distinctly, if during the point-by-point irradiation a plurality of pattern points located alongside one another are irradiated simultaneously in accordance with the pattern by means of an appropriate number of irradiation points.

Particularly good screening properties are achieved if the covering layer contains fine light-absorbing and/or light-reflecting particles, in particular carbon black, or fine metal particles, pigments and/or radiation-absorbing chemicals. Provision can expediently be made that the radiation-absorbing chemicals or pigments are added to a wax solution, which is applied to the first radiation-sensitive layer in order to construct the covering layer.

Another advantageous possibility is that the fine light-absorbing or light-reflecting particles are suspended in gelatin or polyvinyl alcohol.

If the covering layer is intended to contain fine metal particles as light-absorbing and light-reflecting agents, it is expedient if the suspension of fine metal particles in gelatin is produced by reduction of metal salts, in particular silver halides, dissolved in gelatin. This distinctly improves the operating safety in the process according to the invention, since very fine metal particles are very flammable and highly explosive.

The covering layer may be particularly simply applied using an immersion-coating process, in particular if the desired covering layer is intended to be 1 μm to 20 μm, preferably 7 μm to 14 μm, in particular 10 μm, thick.

If the process according to the invention is used for producing flexographic printing formes, then provision is made that the first radiation-sensitive layer is a photopolymer layer, in particular a photoelastomer layer, with a thickness of 1 mm to 10 mm, preferably of 2 mm to 5 mm.

In particular in the case of producing screen printing stencils or matrices for the production of carrier screens by electroplating, it is expedient if the first radiation-sensitive layer is a photoresist layer, which is preferably applied to the carrier using an immersion-coating process. Expediently, in this case both photoresists based on gelatin or polyvinyl alcohol, and also photoresists based on synthetic resin may be employed. In order to prevent the formation of cracks during the drying or hardening of the photoresists, or during the later use of the finished printing forme, provision is made according to the invention that the photoresist layer has substances added to it to increase its elasticity. In particular in the case of using photoresists based on gelatin or polyvinyl alcohol, plasticizers, for example glycerin or glycol, can be mixed with the photoresist.

For the production of flexographic printing formes, it is advantageous if the carrier has a full area closed surface, to which the first radiation-sensitive layer is applied.

For flat or planar screen-printing stencils, it is expedient if the carrier is formed from a textile fabric, in particular from a silk gauze fabric, which is preferably reinforced by the deposition of metal, chemically and/or by electroplating. The deposition of metal not only reinforces the particularly fine fabric mechanically, but its reflection capability for radiation is also improved. As a result, the screen fabric is not damaged during the removal of the covering layer and during the exposure of the first radiation-sensitive layer, if the radiation used for this is set somewhat too high.

BRIEF DESCRIPTION OF THE DRAWINGS

The invention is explained in more detail in the following text, by way of example, using the drawing, in which.

DETAILED DESCRIPTION OF THE PREFERRED EMBODIMENTS

Figure 1:
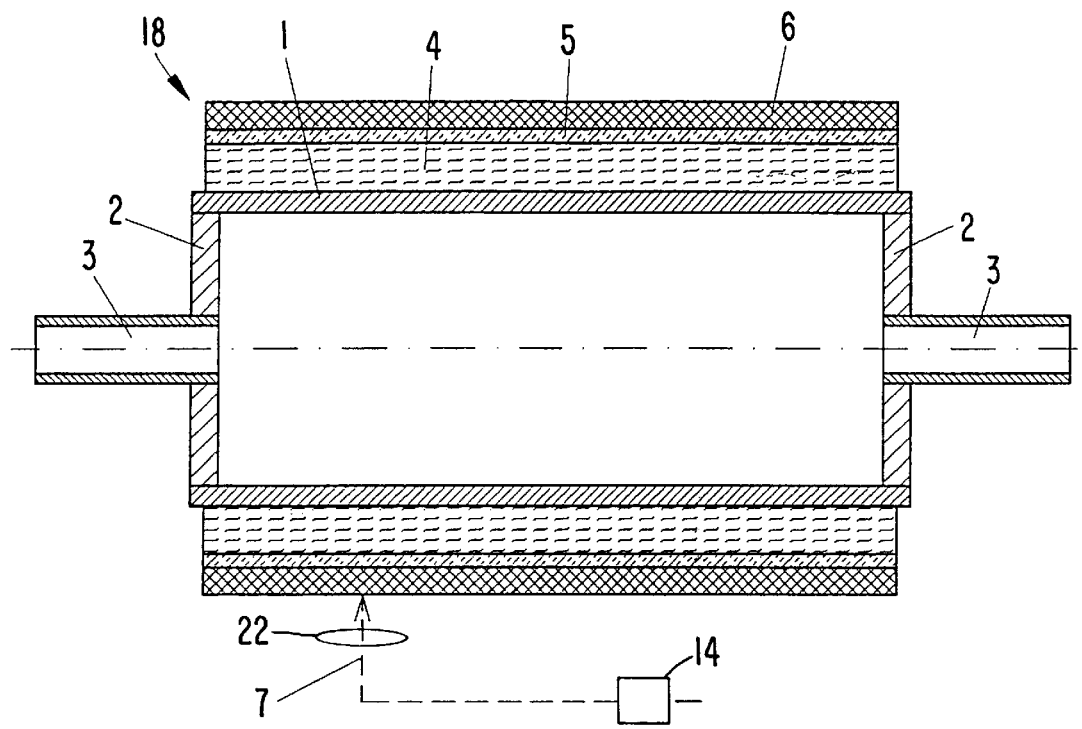
FIG. 1 shows an axially-parallel longitudinal section through a cylindrical blank for producing a printing forme according to a first exemplary embodiment of the invention.

In the various figures of the drawing, mutually corresponding parts are provided with identical reference symbols.

A blank, shown in FIG. 1; for a printing forme, is designated the printing forme 18 in as following text. The printing forme 18 has a carrier tube 1, at whose ends cover plates 2 and axle stubs 3 are welded in or bonded in. The axle stubs 3 in this case serve for the later clamping of the printing forme 18 on a printing machine.

Applied to the carrier tube 1 is a first radiation-sensitive layer, in particular a photopolymer layer, preferably a photoelastomer layer 4, having a thickness of preferably 2 to 5 mm. This photoelastomer layer 4 is generally constructed from a photoelastomer plate, for example Nyloprint, which is wound around the carrier tube 1. The photoelastomer of this plate initially has only a low degree of polymerization and can therefore be deformed both elastically and plastically and, under the action of heat, bonds to the carrier tube 1 and at the point where it abuts itself at temperatures of about 120° C. In this case, no crosslinking reaction occurs yet, with the result that the radiation sensitivity or light sensitivity of the photoelastomer layer 4 applied to the carrier tube 1 is not impaired.

Instead of the photoelastomer layer 4, which is relatively thick at 2 to 5 mm, as is used for flexographic printing formes, it is also possible, for example, for a thin photoresist layer or the like to be provided as the first radiation-sensitive layer, if a screen-printing forme is intended to be produced using the process according to the invention. In this case, an appropriate screen cylinder is then to be provided instead of the carrier tube 1.

A covering layer 5 is then applied to the photoelastomer layer 4, for example by means of immersion coating. Here, for example, an aqueous solution of gelatin or polyvinyl alcohol is applied, which has about 10% by weight of carbon black added to it. However, it is also possible to use a gelatin in which very fine metal particles are suspended. Since such small metal particles are highly explosive, the suspension can be produced by a reduction of metal salts, for example silver halides, dissolved in gelatin. The gelatin surrounding the very fine metal particles produced in this way then prevents their oxidation and thus an explosion.

In the case of immersion coating for applying the covering layer 5, a ring doctor (not illustrated) is drawn from the top to the bottom over the printing forme 18, which is arranged with its axis vertical. Heated gelatin solution in the annular space is placed between the ring doctor and the photopolymer layer 4, and during the upward movement, remaining solution adheres as a thin film on the surface of the photopolymer layer 4. The thickness of this film can be varied by means of the temperature of the gelatin solution, by the proportion of solids, by the proportion of carbon black or metal particles in the gelatin solution, by the intensity of cooling which may be performed at the same time, by a cold-air stream, and by the speed of the upward movement.

During the cooling of the gelatin or polyvinyl alcohol film, which takes place rapidly, the latter solidifies and is freed of its water component in a subsequent intermediate drying operation. By means of the addition of small proportions of plasticizers, for example glycerin or glycol, the gelatin or polyvinyl alcohol film can also be kept sufficiently elastic, following the drying, such that the formation of cracks in the drying layer, that is the forming covering layer 5, can be prevented. If required, tanning of the covering layer 5 can be carried out by spraying with formaldehyde or alum solution. However, it is necessary to take into account here that the covering layer 5 may be removed more easily or more rapidly in a later process step if the gelatin or polyvinyl alcohol is not tanned.

For the production of the covering layer 5, it is also possible to use a wax solution, to which the same or similar UV-absorbing or UV-reflecting chemicals or pigments are added, in order to increase the natural UV absorption of the waxes. In addition to carbon black, consideration is also given to such derivatives of benzophenone, in particular if its substituents, such as hydroxyl and/or alkoxy groups are located in the second and/or fourth position. Furthermore, substituted benzotriazoles are also suitable, as are phenyl-substituted acrylates (cinnamic acid derivatives), which optionally have cyano groups in the second position. Finally, consideration is also given to salicylates, organic nickel complexes or natural materials such as umbelliferon or urocanic acid.

For the covering layer 5, however, it is also possible to use synthetic resins, preferably epoxy resin, polyester resin or methyl methacrylate resin, to which substances which increase the light-screening capability are likewise added. In order to prevent the formation of cracks during the crosslinking of the resins, these components, which have greater elasticity, are added. In addition, the covering layer may also consist of a thermoplastic, for example polyethylene.

After the construction of the covering layer 5, as the third layer, a second radiation-sensitive layer, in particular a photosensitive layer, preferably a photoresist layer 6, is applied. In this case, either a light-hardenable photoresist or a photoresist that can be decomposed by light is used as the photoresist for the photoresist layer 6. The application of the photoresist layer 6 is in this case expediently also carried out using the immersion-coating process. The photoresist for the photoresist layer 6 is primarily present in alcoholic or ketonic solution. These solvents do not cause a gelatin layer to swell. However, it is also possible for aqueous emulsions of photoresists to be used if, following contact between the covering layer 5 and the photoresist emulsion, and until the drying of the photoresist layer 6 has been carried out, any further mechanical contact with the coated printing-forme surface is avoided. These last-named emulsions are particularly suitable for the application of a photoresist layer 6 to a covering layer 5 consisting of wax, since they do not dissolve the wax.

Following the drying of the photoresist layer 6, this is irradiated in accordance with a pattern to be printed later using the printing forme 18. For this, radiation is used to which the second radiation-sensitive layer is sensitive. In the case of the photoresist layer 6 described here, the irradiation is therefore carried out with the aid of a light beam, in particular with the aid of a laser beam. Depending on the photoresist used, ultraviolet or visible light can be used as the light for the exposure of the photoresist layer 6. For instance, it is possible to carry out the exposure of the photoresist layer 6 with the aid of a laser whose light lies in the UV range, blue range or green range, or in particular with the aid of an argon ion laser, whose wavelength lies in the visible blue range at 488 nm.

One advantage of the exposure using the said wavelength is that prior crosslinking of the photoelastomer layer 4 lying under the photoresist layer 6 hardly takes place, since light with a higher quantum energy and thus shorter wavelength, light from the ultraviolet spectral range, is required for crosslinking this photoelastomer layer 4. In order to be able to absorb the laser radiation used, it may be necessary, in the case of specific compositions of the covering layer, for a further pigment to be added.

At its point of impingement of the photoresist layer 6 of the printing forme 18, the laser beam 7 is focused by a lens arrangement or laser optics 22 to a beam diameter of about 20 to 30 $\mu$m. The exposure is carried out in accordance with the pattern to be printed, that is to say the laser beam 7 is interrupted, at the points not to be exposed, by means of an appropriate arrangement with a stop function. For instance, an acousto-optical or electro-optical switch 14 can be used for the interruption of the laser beam 7. In the case of this method of optical control of the laser beam 7, it is possible for about $10^6$ pattern points to be exposed per second.

Following the exposure, the photoresist layer 6 is developed. During this first development, in the event that a light-hardenable photoresist, a negative resist, was used for the photoresist layer 6, the unexposed and thus non-crosslinked photoresist is washed out. This normally takes place using a developer matched to the photoresist used. An alkaline developer with about 2% soda and, if appropriate, likewise low proportions of sodium or potassium hydroxide, can expediently be used. During this development, following the washing out of the noncrosslinked photoresist layer, the covering layer 5 that is no longer covered is also dissolved by the alkaline developer and removed. The parts of the covering layer 5 which has to be removed for their structuring in accordance with the pattern to be printed are therefore concomitantly removed at the same time during the development of the photoresist layer 6. The parts of the photoresist layer 6 that are not removed during the development thus protect the parts of the covering layer 5 that are not to be removed and hence serve as a structuring mask 6' for the covering layer 5.

In the case of using light-hardening photoresists, which are not processed using alkaline developers, the covering layer 5, if it is a gelatin layer, must be removed following the photoresist development using a slightly alkaline solution. For example, a soda solution at the places no longer covered by the photoresist layer 6 must be removed. At the same time, it is of course necessary for the covering and light-hardened photoresist of the resist layer 6 to have an adequate resistance to the alkaline solution. Covering layers 5 composed of wax can be washed out, following the development of the light-hardenable photoresist layer 6, using benzene or a benzene/water emulsion.

Figure 2:
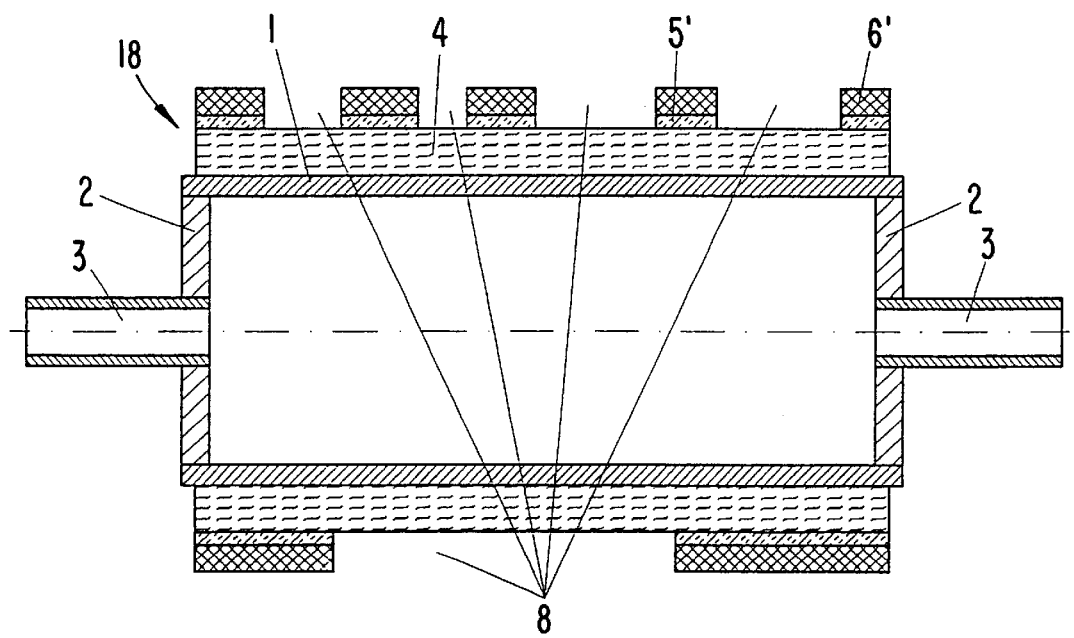
FIG. 2 shows a sectional illustration corresponding to FIG. 1 of the blank following a first exposure and development.
Figure 3:
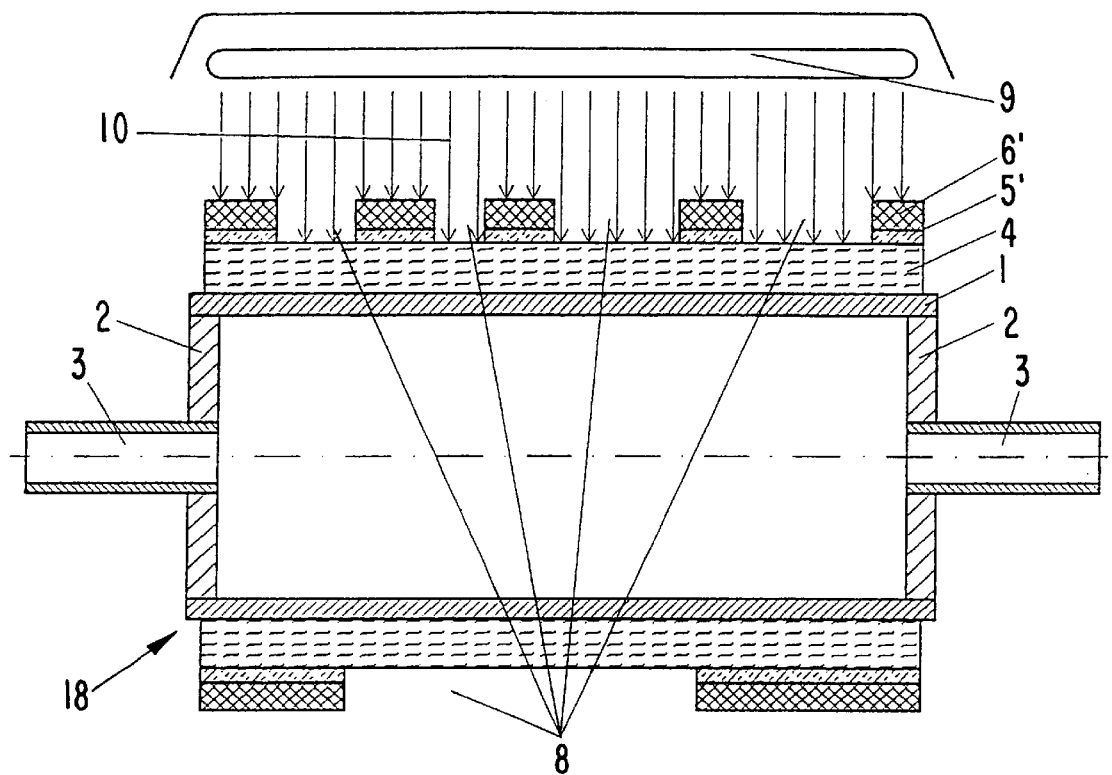
FIG. 3 shows a sectional illustration of the blank according to FIG. 2 during a second exposure.

The result of this pattern-forming process is the printing forme 18 illustrated in FIG. 2, in which the first radiation-sensitive layer, that is to say in the exemplary embodiment the photoelastomer layer 4, is covered by an irradiation mask 5' and thus, in accordance with the pattern, has exposed places 8, through which the exposure of the photoelastomer layer 4 can take place. As illustrated in FIG. 3, the large-area exposure of the photoelastomer layer 4 takes place for several minutes using a strip of light 10 produced by a lamp 9, in particular a xenon lamp. Instead of the xenon lamp, a metal halide vapour lamp may also be employed. In this context, metal halide vapour lamps are advantageous in terms of their energy balance, since they emit light only in the range of the sensitivity maximum of the usual photopolymers, and emit hardly any heat radiation, with the result that the surface of the printing forme 18 is not impermissibly heated.

The exposed places of the photoelastomer layer 4 are deeply and durably crosslinked given an appropriately long exposure time. In this case, it is expedient to expose the photoelastomer layer 4 to the lamp 9 only until the crosslinking is just sufficient for the following developing operation at the exposed places 8, that is to say that the crosslinked places can just adequately withstand the chemical and mechanical attack during the development. This has the advantage that the regions of the photoelastomer layer 4 covered by the covering layer 5 remain noncrosslinked, even if the UV-light-proof covering by the covering layer 5 is possibly incomplete, where a small part of the UV light incident on the covering layer 5 could pass through the covering layer 5.

Figure 4:
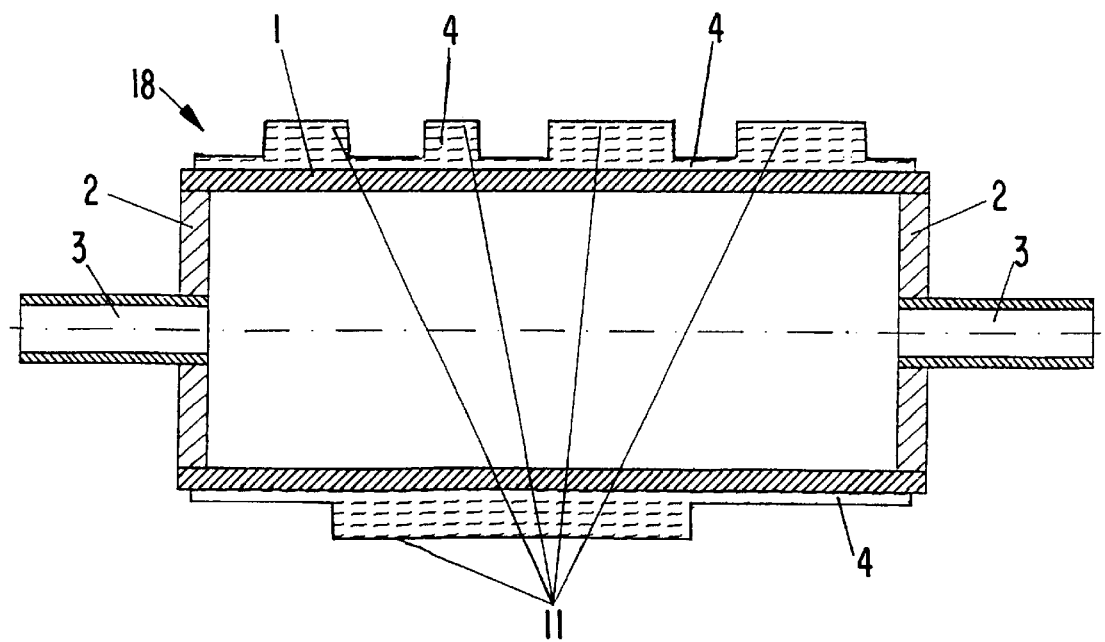
FIG. 4 shows a sectional illustration of the finished cylindrical printing forme following the last development.

Following the exposure of the photoelastomer layer 4, illustrated in FIG. 3, the printing forme 18 and the photoelastomer layer 4 are developed, in order to obtain the finished printing forme 18 illustrated in FIG. 4. To this end, the printing forme is put into a developing bath with a developer which is again alkaline. The latter is now so alkaline that the relatively thin photoresist layer 6, which is, for example, about 10 μm thick, and is still present in accordance with the pattern and hardened, in spite of crosslinking is immediately attacked and removed. At the same time, the irradiation mask 5', consisting of gelatin or wax, is also removed. Even if these two layers are not attacked by the developer used for the development of the photopolymer of the photoelastomer layer 4, the mechanical stresses exerted, during the development process, on the covering layer 5 and the photoresist layer 6 are so great that the two relatively thin layers are very rapidly removed purely mechanically. After the complete removal of the photoresist layer 6 and the irradiation mask 5', the developer has unimpeded access to the unexposed or in any case only weakly exposed places of the photoelastomer layer 4, and begins to remove the photopolymer. The chemical development is supported by intensive mechanical brushing of the photoelastomer layer 4 to be developed in the developer bath.

In the finished printing forme 18 illustrated in FIG. 4 following the development, the elevated places 11 correspond to the regions of the photopolymer layer 4 that have been crosslinked by the action of the light.

The process according to the invention is expediently carried out for the production of cylindrical printing formes, in particular in the production of cylindrical flexographic printing formes using exposure and developing devices, as they are described in the following text.

Figure 5:
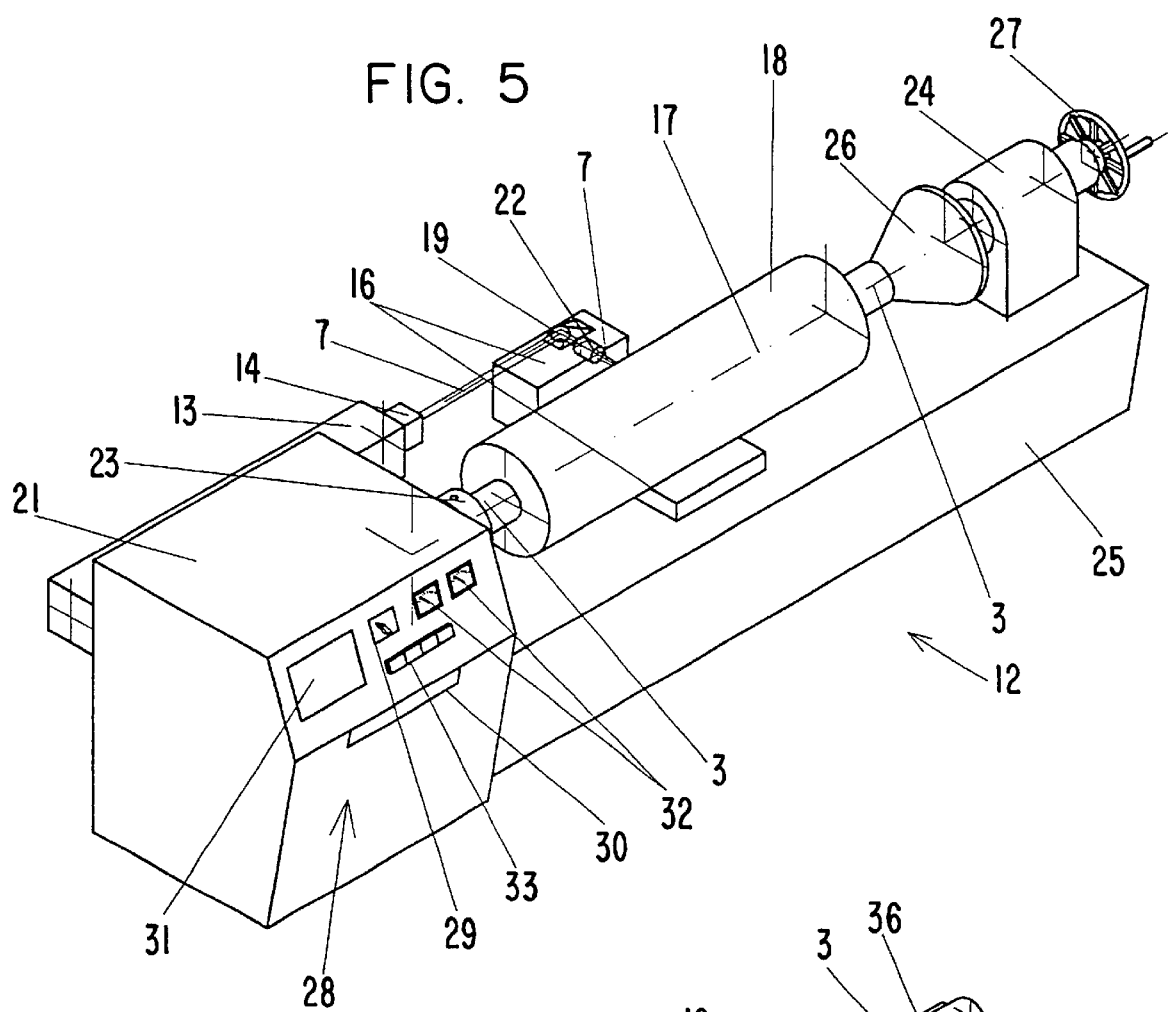
FIG. 5 shows a device for the exposure of a blank for a printing forme in accordance with the pattern.

Although the exposure of the second radiation-sensitive layer, that is to say the photoresist layer 6, can be performed in any known way using any radiation or light source matched to the sensitivity of the photoresist layer 6, this exposure is preferably carried out using an exposure device 12 as is shown in FIG. 5. The exposure device 12 has a laser 13, in particular an argon ion laser, which emits the laser beam 7. The laser beam 7 has a diameter of about 1 to 3 mm and a very low divergence angle. Mounted on a carriage 16, which can be moved slowly in the direction of the axis 17 of the printing forme 18, is a deflection mirror 19, which directs the laser beam 7 onto the cylindrical surface of the printing forme 18, that is to say onto the cylindrically located photoresist layer 6. Provided in front of the point of impingement of the laser beam 7 on the printing forme 18 is a lens arrangement or laser optics 22, which focuses the laser beam 7 to a diameter of about 30 μm in the region of the point of impingement. Although the printing forme 18 runs virtually circularly, in the case of individual printing formes a circularity error of about 0.1 mm may still occur occasionally. The laser optics 22 are expediently designed to have a focal length of about 50 to 150 mm. In the case of a laser 13 having a low beam divergent angle, the diameter of the beam width in the region of the focus varies by a maximum of 1% in the event of a circularity deviation of the printing forme 18 of 0.1 mm, so that tracking or re-regulation of the laser optics 22 can be dispensed with.

During the exposure of the photoresist layer 6 in accordance with the pattern, the printing forme 18 rotates with a uniform speed, with the result that the exposure light spot on the photoresist layer 6, of the printing forme 18, describes a helix. The rotational movement is in this case imparted to the printing forme 18 by a drive accommodated in a headstock 21, to which the left axle stub 3 is connected via a chuck 23. The right axle stub 3 of the printing forme 18 is in this case held by a tailstock 24. Located underneath the printing forme 18 is the bed 25 of the exposure device 12, which connects the headstock 21 to the tailstock 24, in a manner similar to that in a lathe. The bed 25 of the exposure device 12 guides the carriage 16 during its movement parallel to the axis 17 of the printing forme 18.

A supporting cone 26 on the tailstock 24 engages into the hollow end of the right axle stub 3, and can be finely adjusted to various printing-forme lengths by means of a handwheel 27 on the tailstock. An additional coarse setting can be made by displacing the tailstock 24 on the bed 25 in the direction of the axis 17 of the printing forme 18. It is also possible to see, on the headstock 21, an operating panel 28. A main switch 29 serves for the electrical connection to or for the isolation from the mains. An input keyboard in a withdrawable drawer 30 is provided for the convenient setting of various necessary operating parameters, such as machine rotational speed, resolution of the pattern and the like. The input data, the progress of the operation and, if appropriate, fault messages are output via a monitor 31. The respective pattern to be processed can also be displayed on the monitor 31. Instruments 32 also indicate very important operating data continuously, for the purpose of monitoring. The row of switches 33 contains an emergency stop push button, push buttons for switching the monitor 31 on and off and push buttons for the manually-controlled displacement of the carriage 16 during the setting-up phase.

With respect to the holding and the drive of the printing forme 18, the exposure device 12 described is matched to a flexographic printing forme, such as is shown, for example, in FIG. 4. For other cylindrical printing formes, the mounting of the cylindrical printing forme and its drive has to be carried out suitably in a corresponding way and, for example, is shown for screen-printing cylinders in FIG. 15 and will be explained further below.

Instead of the helical exposure of the cylindrical photoresist layer 6 using an individual light spot, the exposure can also be performed simultaneously using a plurality of light spots arranged alongside one another in the longitudinal direction of the axis 17 of the printing forme 18. In this case, for example, a cylindrical pattern strip is exposed during one rotation of the printing forme 18. During the rotation, the carriage 16 is then displaced by the width of the exposed pattern strip, in order to expose a pattern strip, seamlessly adjacent thereto. During the rotation of the printing forme 18, an appropriate displacement of the carriage 16 is performed.

Figure 6:
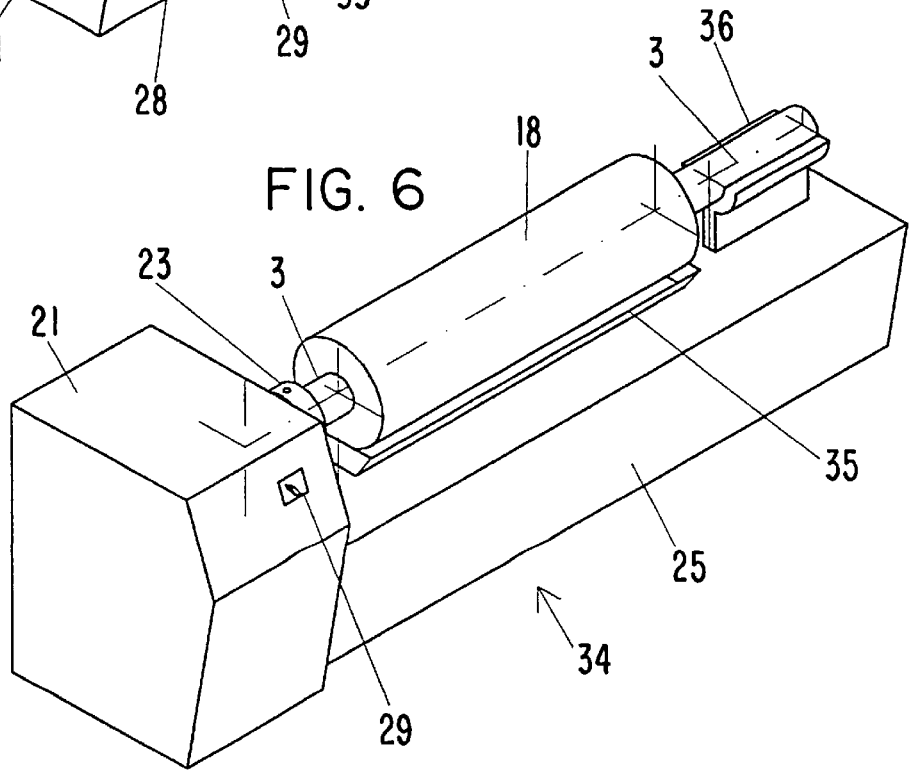
FIG. 6 shows a device for developing the blank following the first exposure.

Following the exposure of the printing forme 18 in the exposure device 12, the development of the photoresist layer 6 is performed with the aid of a liquid developer in a developing device 34, such as is shown by way of example in FIG. 6. In this developing device, the printing forme 18 rotates only slowly while its surface dips with a low depth into a flat tray 35, which contains the liquid developer. The printing forme 18 is driven by a drive in the headstock 21 via a chuck 23, which carries the axle stub 3, on the left in FIG. 6, of the printing forme 18. The right axle stub 3 can be supported simply in an open bearing half-shell 36, because of the very low rotational speed.

The rotational motion of the printing forme 18 is switched on and off by means of a main switch 29. A time expenditure of a few minutes is necessary for the development. After the completion of the development, depending on the type of the resist used, that is to say depending on whether the photoresist can be hardened by light or decomposed by light, the unexposed or the exposed places of the photoresist layer 6 are removed. During the development of the printing forme 18 and the photoresist layer 6, it is generally the case that the places of the covering layer 5 no longer covered by the photoresist of the photoresist layer 6 are also removed at the same time. Should the developer not be suitable for this or be exhausted, then it is also possible for the covering layer 5 to be removed on the same developing device, using a different bath. The last residues of the developer or of the last bath are removed by rinsing with water following the completion of the development.

The printing forme 18 developed on the developing device 34 shown in FIG. 6 has the layer construction illustrated in FIG. 2, with an untreated photoelastomer layer 4 and photoresist layer 6 and covering layer 5 structured in accordance with the pattern.

Figure 7:
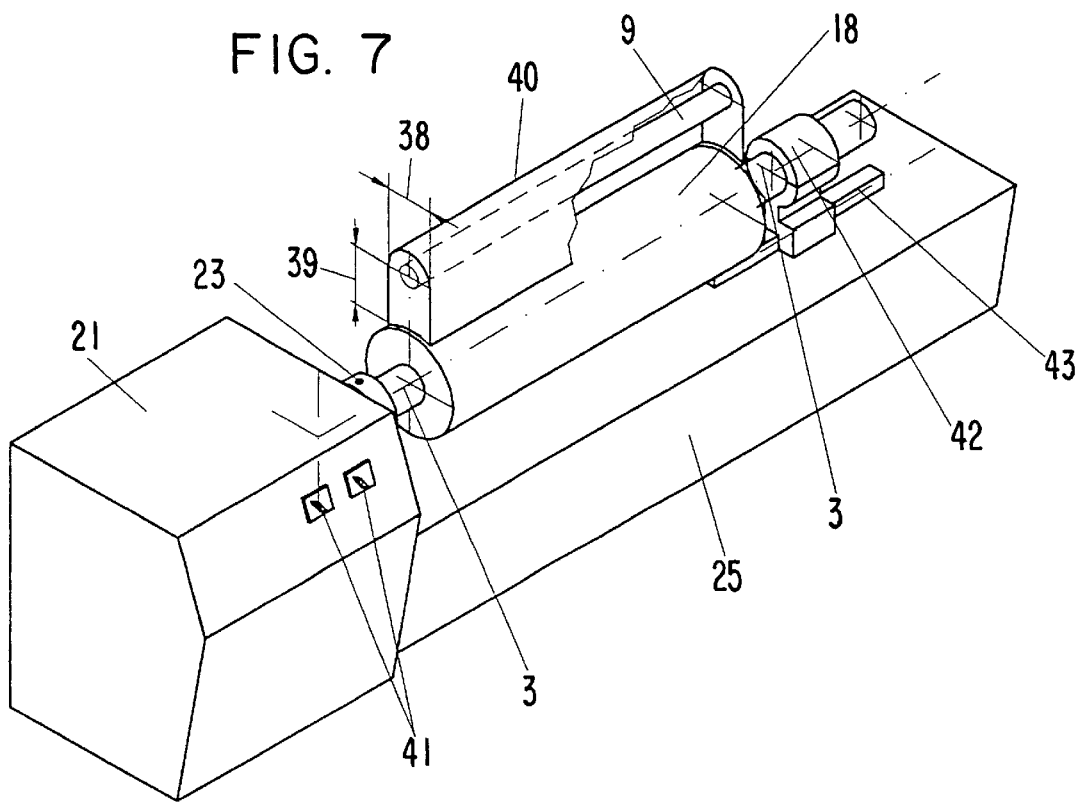
FIG. 7 shows a device for the large-area exposure of the blank.

The printing forme 18 prepared in this way is then exposed over a large area, for example in an exposure device as is shown in FIG. 7. For this, the exposure device has a lamp 9 which is, for example, a metal halogen vapour lamp. In this case, the lamp 9 expediently has the shape of a lamp bar with a circular cross-section and extends over the entire length of the printing forme 18. The factors having a significant influence on the quality of the engraving are the width 38, viewed in the circumferential direction of the printing forme 18, of a lamp housing 40, and the distance 39 of the lamp 9 from the printing forme 18 in the radial direction. The width 38 of the lamp housing 40 should not exceed one third of the diameter of the printing forme 18, since otherwise, as a result of undercutting radiation effects, the edge regions of the places of the photoelastomer layer 4 covered by the covering layer 5 are also crosslinked and thus hardened. This is not desirable, since the sharpness of the lines of the pattern is impaired thereby.

In special cases, the width 38 of the lamp housing 40 is even restricted to only about 10% of the diameter of the printing forme 18. A greater distance 39 and a smaller width 38 increase the fidelity of the contours, but prolong the necessary exposure time because of the lower illuminated area of the printing forme 18 and the lower illumination intensity. A smaller distance 39 and a greater width 38 have the opposite effect.

Provided on the headstock 21 are switches 41 each for the rotary drive of the printing forme 18 and the lamp 9. The switches are expediently electrically interlocked in such a way that the lamp 9 can only be switched on if the printing forme 18 is already rotating. In this arrangement, the right axle stub 3 of the printing forme 18 is rotatably mounted in a fold-up supporting bearing 42, which can be brought on a guide 43 into a position matched to the length of the printing forme 18.

Following the second exposure of the printing forme 18, that is to say following the large-area exposure of the photoelastomer layer 4, the printing forme 18 is finally developed in a further developing device.

Figure 8:
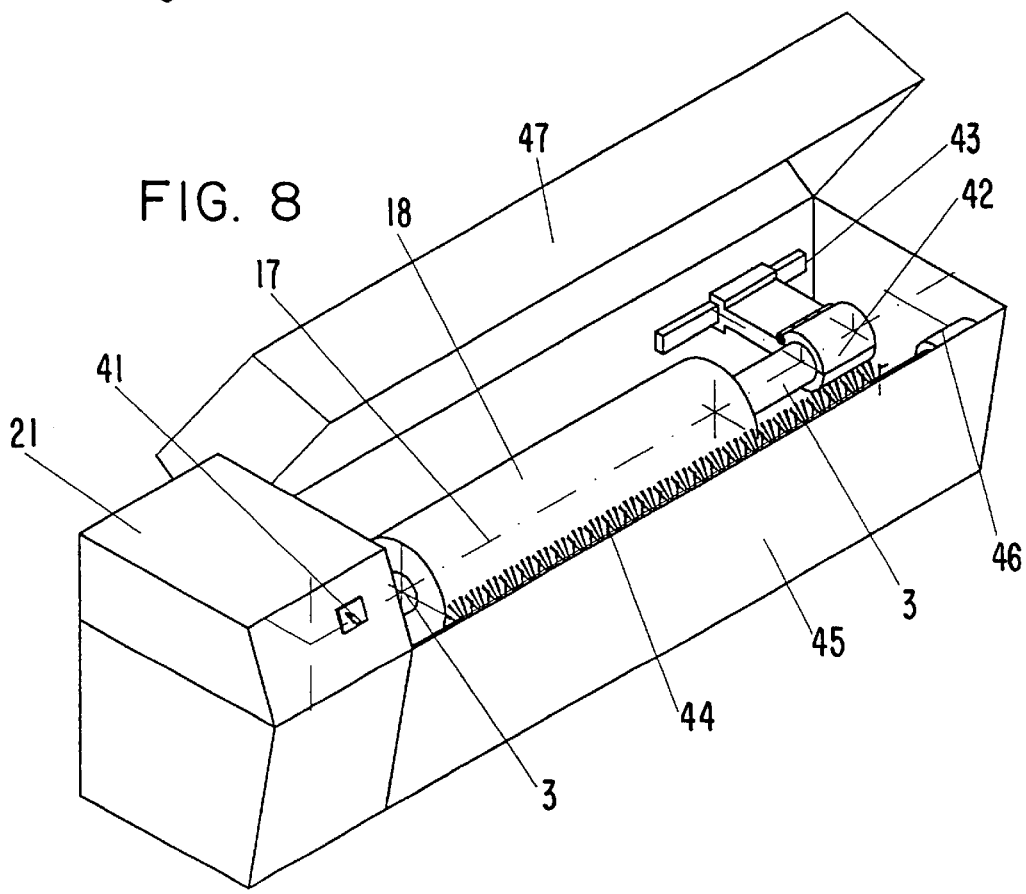
FIG. 8 shows a device for the development of the blank following the large-area exposure.

As is shown in FIG. 8, the printing forme 18 is mounted in the manner of a lathe in a trough 45, so that it can be set rotating in a headstock 21 by a rotary drive (not illustrated). By means of actuating a switch 41, the rotary drive in the headstock 21 is switched on and the printing forme 18 is set rotating. In addition, a brush roll 44 is driven at a relatively high rotational speed. The printing forme scoops developer liquid continuously out of a developer sump (not visible) in the trough 45, while developer fluid is sprayed onto the brush roll 44 from a strip of nozzles which are covered by the front wall of the trough 45 and are therefore not visible.

The intensive contact between the photoelastomer layer 4 of the printing forme 18 and the developer liquid, and the intensive mechanical abrasion as a result of the rotating brush roll 44 ensure the rapid removal or washing out of all the noncrosslinked regions of the photopolymer layer 4, of which, after the completion of the development, only the crosslinked regions and a thin, not yet crosslinked base layer remain, which is necessary for the fastening of the photoelastomer to the carrier tube 1. This thin base layer 4 is not dissolved and washed out, in order to be able to fasten even relatively small crosslinked regions of the photoelastomer reliably to the carrier tube 1.

The developing operation is therefore broken off at a predetermined time.

In the developing device, too, the right axle stub 3, facing away from the headstock 21, of the printing forme 18 is held by a simple supporting bearing 42. The bearing 42 is arranged on a guide 43 such that it can be displaced in the direction of the axle 17 of the printing forme 18, in order to be able to insert printing formes 18 of various lengths into the developing device.

For the simpler insertion and removal of the printing forme 18, the supporting bearing 42 is a divided design. The upper half can be folded upwards after being unlocked. The brush roll 44 is rotatably mounted at its two ends in sliding bearing bushes 46. Since the developer liquid is sprayed intensely during the developing operation and the intensive brushing occurs on the surface of the printing forme 18, the developing device has a folding lid 47, which tightly closes the trough 45.

A further exemplary embodiment of the invention will be explained in more detail using the production of a screen-printing stencil, with reference to FIGS. 9 to 17.

Figure 9:
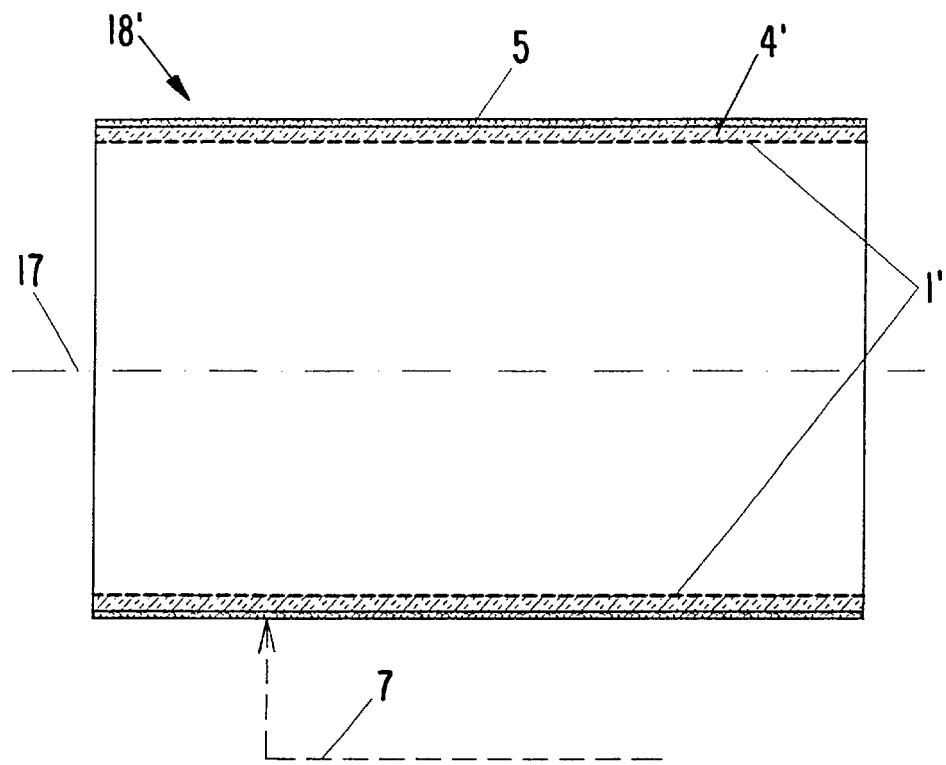
FIG. 9 shows an axially parallel longitudinal section through a cylindrical blank for producing a screen-printing stencil according to a second exemplary embodiment of the invention.

FIG. 9 shows a blank for a screen-printing stencil 18', which is designated as such in the following text for reasons of simplicity, irrespective of the production stage. The screen-printing stencil 18' has, as carrier, a thin screen cylinder 1', on which a photoresist layer 4' is laid as the first radiation-sensitive layer, and is covered by a covering layer 5. The photoresist layer 4' can consist of gelatin or polyvinyl alcohol having a photosensitive tanning agent, to which potassium dichromate is added. Under the action of short-wave radiation in the UV range, a gelatin treated in this way or a polyvinyl alcohol treated in this way crosslinks, even in the dry state. The resist, therefore, becomes insoluble in water and significantly more resistant to chemical attack, such as occurs during the action of a developer or of printing chemicals.

By contrast, the noncrosslinked or untanned gelatin, and likewise the untanned polyvinyl alcohol, may be washed out very easily by warm water or an alkaline aqueous solution. This operation is designated as the development step.

Epoxy resins or methyl methacrylate resins can also be used for the photoresist layer 4'. These resins are primarily diluted using an alcoholic or ketonic solvent, or used in the form of an aqueous emulsion of such solutions. These solutions often contain an optical sensitizing agent in order to increase the light sensitivity or to displace the sensitivity into a longer-wavelength light range. Photoresist layers constructed in this way are also photosynthetically crosslinked or hardened by the action of light.

In addition to negative resists of this type, so-called positive resists can also be used for the photoresist layer 4', in which the otherwise insoluble resist is damaged by the action of radiation or light and hence is made sensitive to the attack of a developer that is subsequently employed.

The same solvents, layer-forming substances and UV-absorbing or UV-reflecting substances are used for the covering layer 5 as in the case of the covering layer 5 described with reference to the first exemplary embodiment. In addition to the use of black pigments, such as carbon black, in the case of covering layers it is also possible to use other dyestuffs such as Sudan blue from BASF or combinations of coloured dyes, such as a mixture of Sudan blue dye with Novaperm yellow igment from Hoechst.

The application of the photoresist layer 4' and the covering layer 5 is preferably performed using the immersion-coating process described above. This has the advantage, in particular for the application of the covering layer 5, that this layer itself can be applied with a thickness that is identical over the entire screen-printing stencil, even if the photoresist layer 4' has a wavy surface as a result of drying-induced shrinkage, as illustrated, for example, in FIG. 10.

It should be pointed out further that the photoresist layer 4' is dried before the application of the covering layer 5, and likewise the covering layer 5 is dried after its application, if these layers contain water or other solvents. The drying is most often carried out in this case in a warm-air oven, in which the circulated air is continuously filtered.

Figure 10:
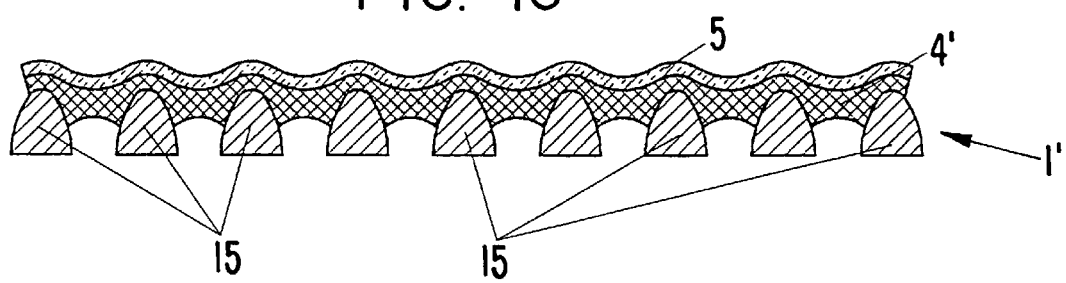
FIG. 10 shows an enlarged sectional illustration of the coated screen from FIG. 1.
Figure 11:
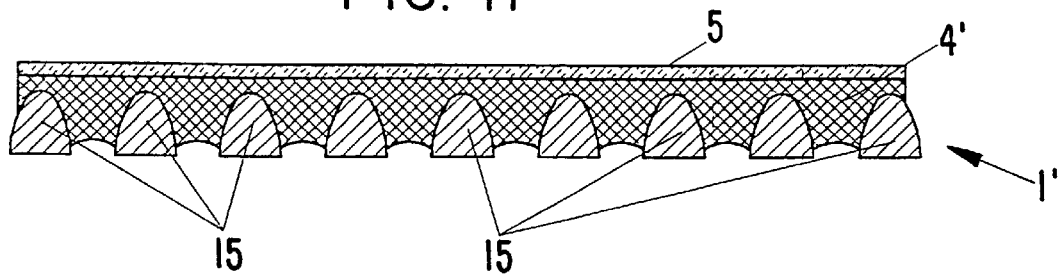
FIG. 11 shows an enlarged sectional illustration of a screen having another coating.

It is possible to see in FIG. 10 that the screen cylinder 1' comprises individual webs 15, which are built up by electrotyping. Instead of a screen cylinder 1' built up by electrotyping, a screen cylinder made of a metal fabric can also be used. Furthermore, it is possible, particularly in the case of flat screen-printing stencils, to use textile fabrics, in particular fine silk gauze fabric, in order further to improve the printing quality achievable with the finished screen-printing stencil. In the case of using textile fabrics, it is advantages to provide a metal coating that does not impair the screen structure, in order to prevent damage to the screen fabric by the radiation used during the removal of the covering layer 5 and during the exposure of the photoresist layer 4'.

The photoresist layer 4' illustrated in FIG. 10 exhibits an uneven surface, since it is built up from a resist containing a great degree of solvent, as a result of which the photoresist layer 4' has shrunk severely during the drying as a result of the evaporation of the solvent. By contrast, the photoresist layer 4' in FIG. 11 consists of a polymerizable resist system, with the result that this layer shrinks slightly and thus maintains a flat or smooth surface.

The covering layer 5 applied to the photoresist layer 4' according to FIG. 10 remains equally thick overall, thanks to the immersion-coating process used.

In order to obtain a structured radiation mask 5' in accordance with the pattern, the covering layer 5 is removed in accordance with the pattern. This can be performed, for example, mechanically or chemically.

If the covering layer 5 is to be removed chemically, it is then necessary, for example, for a structuring mask made of wax or resin to be sprayed on in accordance with a pattern. The mask should withstand a subsequent etching attack on the covering layer 5, with the result that the covering layer 5 remains on the screen-printing stencil at the places covered by the structuring mask, whereas it is removed at the uncovered places.

In the case of the exemplary embodiment described, however, the covering layer is removed with the aid of radiation. Laser radiation is preferably used here, whose wavelength extends from the near infrared range (800 nm to 1 $\mu$m when using laser diodes; 1.06 $\mu$m when using a Nd-YAG laser) as far as the thermal radiation range (10.6 $\mu$m in the case of a $CO_2$ laser). In this case, the removal of the covering layer 5 is performed by evaporation. However, it is also possible to remove the covering layer 5 by photolysis or shorter wavelengths which lie in the visible range. Radiation in the UV range and in the short-wave spectral range of the visible light, having wavelengths up to about 500 nm is generally used. However, the photoresist layer 4' lying underneath the covering layer 5 may crosslink or harden under the action of the large-area re-exposure which takes place later, where the photo resist layer 40 is constructed from a polymerizable resin system.

Figure 12:
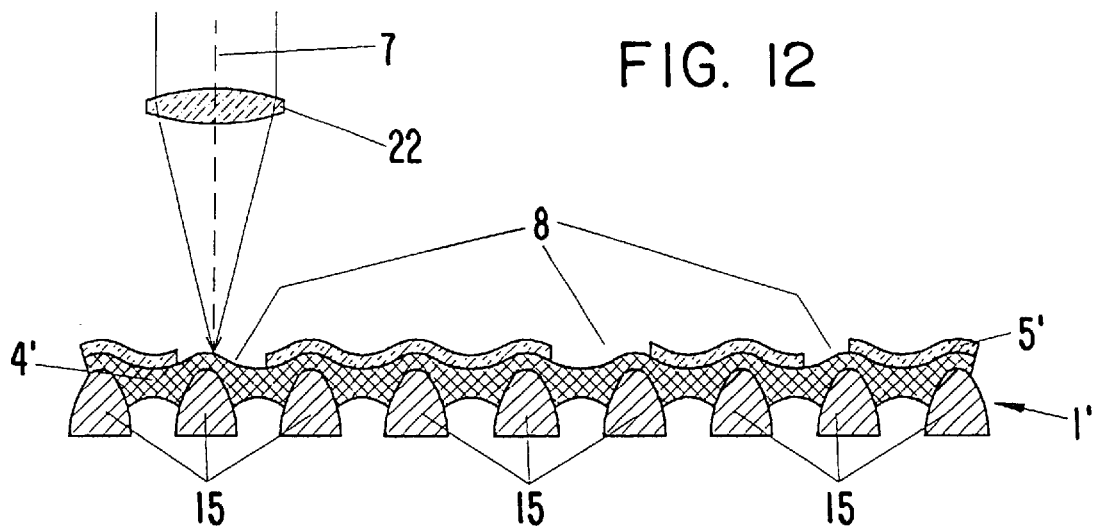
FIG. 12 shows an illustration of the screen according to FIG. 2 during the removal of a covering layer in order to structure an irradiation mask.
Figure 13:
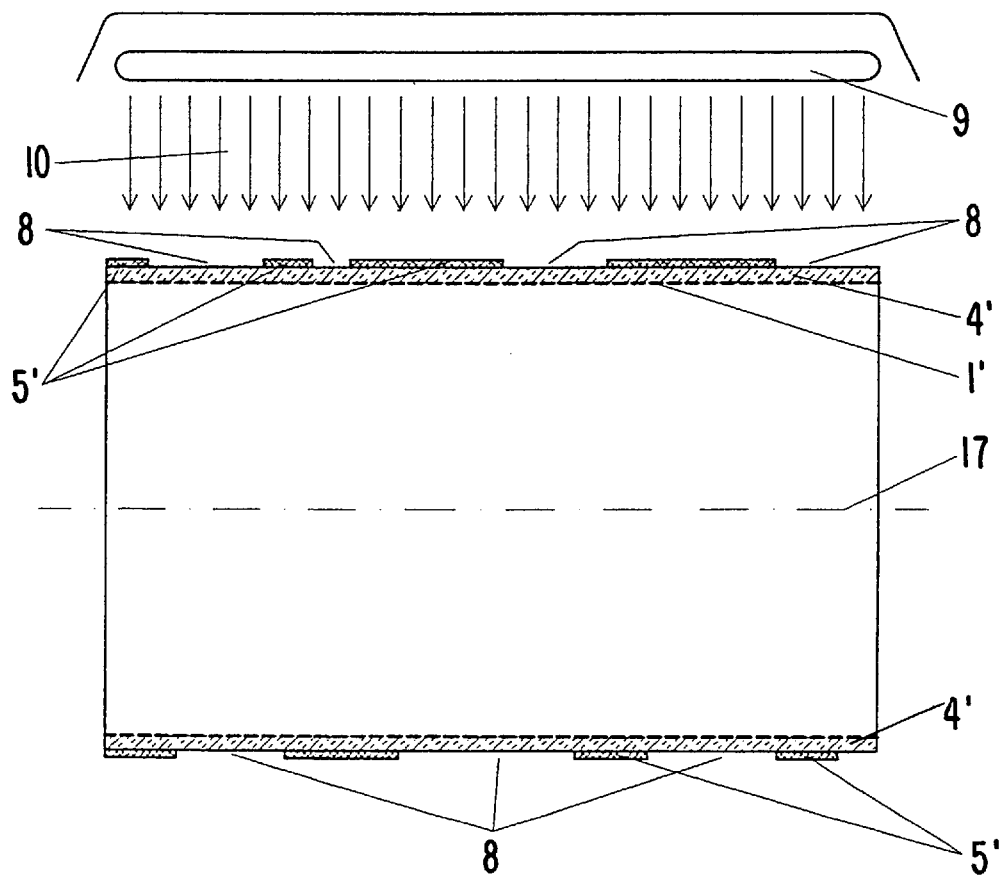
FIG. 13 shows a sectional illustration of the blank according to FIG. 9 during an exposure.

FIG. 12 shows an irradiation mask 5' produced from the covering layer 5, which has been detached in accordance with the pattern by the thermal action of a laser beam 7 in such a way that the photoresist layer 4' has places 8 which are exposed. Places 8 of the photoresist layer 4' are intended either to be photolytically damaged or else hardened during the subsequent large-area exposure shown in FIG. 13.

The laser beam 7 used for the direct removal, conditioned by the pattern, of the covering layer 5 is focused by laser optics 22 in such a way that it has a diameter of 20 to 40 $\mu$m at the point of impingement. The laser beam 7 used in this case has a small beam divergence angle upstream of the laser optics 22, so that given the focal lengths used of between 50 nm and 150 nm, a beam width at the focus, (the point of management), is produced which, measured over a range of 0.1 mm perpendicular to the surface of the screen cylinder 1', changes by only a few percent. Therefore, a circularity error of the order of magnitude of 0.1 mm has virtually no influence on the fidelity of the contour of the engraving.

Figure 14:
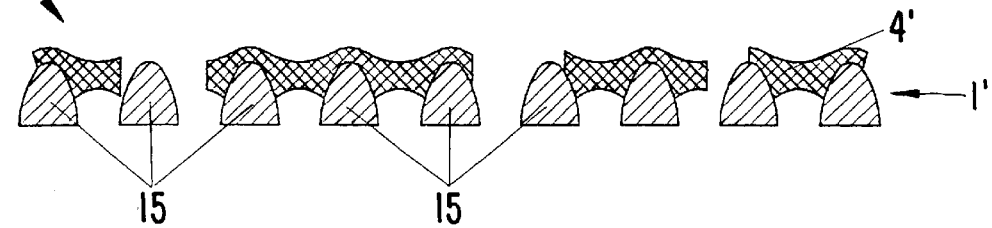
FIG. 14 shows an enlarged sectional illustration of the finished screen following the development.

The removal of the covering layer 5 is preferably carried out in accordance with the pattern using a laser. In order to construct an irradiation mask 5' the photoresist layer 4' is exposed over a large area using a strip of light emitted by a lamp 9. In this case, a metal halide lamp is preferably used as the lamp 9. In the case of this type of lamp, the maximum values of the emission energy lie at wavelengths between 290 and 540 nm, with the result that the photoresist layer is thus irradiated with high-energy UV radiation, which is associated with intense photochemical effects. Depending on the type of resist used, the photoresist layer 2 is either damaged or hardened at the exposed places. In the case of photolytic damaging of the photoresist layer, this can easily be attacked chemically by an alkaline developer, decomposed and therefore detached. One example is a diazo resin, in which under the action of UV radiation, very small nitrogen bubbles form in the photoresist, so that a developer can easily penetrate into the resin and decompose the latter. In the case of resists which are crosslinked under the action of UV radiation, the photoresist layer 4' becomes chemically very resistant at the exposed places, and the unexposed places of this layer can be detached from the screen cylinder 1' by warm water or by a developer during the subsequent development. FIG. 14 shows a screen-printing stencil 18', produced using a positive resist, in an enlarged section.

Figure 15:
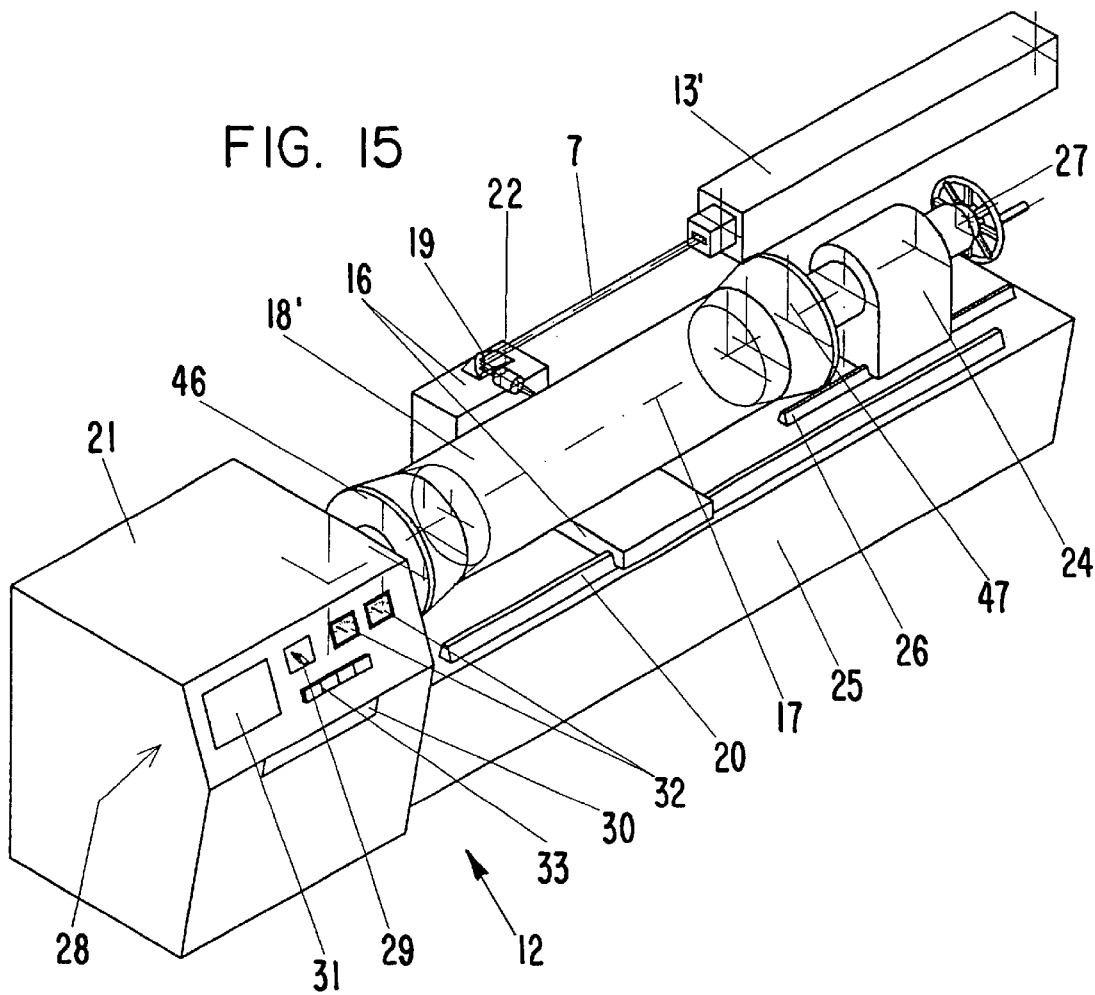
FIG. 15 shows a device for the removal of the covering layer on a cylindrical blank in accordance with the pattern.

The exposure device 12 is shown in FIG. 15, where laser-optical detachment of the covering layer 5 occures to construct an irradiation mask 5'. The device 12 is constructed in a manner similar to a lathe. A neodymium-YAG laser 13' emits a laser beam 7, which has a wavelength of 1.06 μm and a diameter of a few millimetres, as well as a very low divergence angle. If appropriate, these properties of the laser beam 7 are ensured by expansion optics, which can be provided a little downstream of the exit window of the laser.

Instead of a Nd-YAG laser, which is pumped by laser diodes, it is also possible to use a $CO_2$ laser, which is pulsed by switching an electric discharge path on and off. In the latter case, switching frequencies of 10 to 20 kHz may be reached, whereas by switching the laser diodes on and off in the first case, switching frequencies up to about 50 kHz are achievable. If still higher switching frequencies are needed, the laser can also operate in continuous operation, and the beam can be interrupted using an acousto-optical or electro-optical switch.

The advantage of removing the covering layer 5 using a wavelength above 800 nm resides in the fact that neither prior crosslinking nor photolytic decomposition of the photoresist layer 4' lying under the covering layer 5 can occur, and thus a shorter wavelength is required. Of course, precise metering of the optical beam energy of the laser beam 7 is required, since otherwise the photoresist layer 4' can be decomposed thermally.

Mounted on a carriage 16, which is moved slowly in the direction of the axis 17 of the screen-printing stencil 18', is a deflection mirror 19, which directs the laser beam 7 onto the surface of the screen-printing stencil 18'. In this case, laser optics 22 are provided downstream of the deflection mirror 19 in order to focus the laser beam 7.

During the exposure, the screen-printing stencil 18' rotates at a uniform speed, with the result that the light spot of the laser beam 7 describes a helix on the surface of the screen-printing stencil 18'. This rotational movement is imparted to the screen-printing stencil 18' by a drive accommodated in the headstock 21, to which the left end of the screen-printing stencil 18' is connected via a drive cone 46. The right end of the screen-printing stencil 18' is held by a centering cone 47 at the tailstock 24.

Located below the screen-printing stencil 18' is the bed 25 of the exposure device 12, which connects the headstock 21 to the tailstock 24 and carries guides 20 for the carriage 16, which guide the latter precisely parallel to the axis 17 of the screen printing stencil 18' during the operational movement of the said carriage.

In order to be able to work on screen-printing stencils 18' of different lengths, the tailstock 24 is adjustable in the axial direction, whereas the centring cone 47, which engages into the right end of a screen-printing stencil 18', is finely adjustable by means of handwheel 27 on the tailstock 24 for the purpose of line adjustment.

Furthermore, the same operating and indicating devices as were also provided in the case of the exposure device 12 described using FIG. 5 are arranged on the headstock 24.

If the removal of the covering layer 5 is intended to be carried out chemically, using a structuring mask that is sprayed onto the covering layer 5, then a corresponding processing device can be used, which is constructed virtually in the same way as the exposure device described using FIG. 5 or 15. In the case of a device of this type for spraying on a structuring mask, the laser is then left out and, instead of the deflection mirror and the laser optics, spraying nozzles for spraying on a liquid are arranged on the carriage 16.

Figure 16:
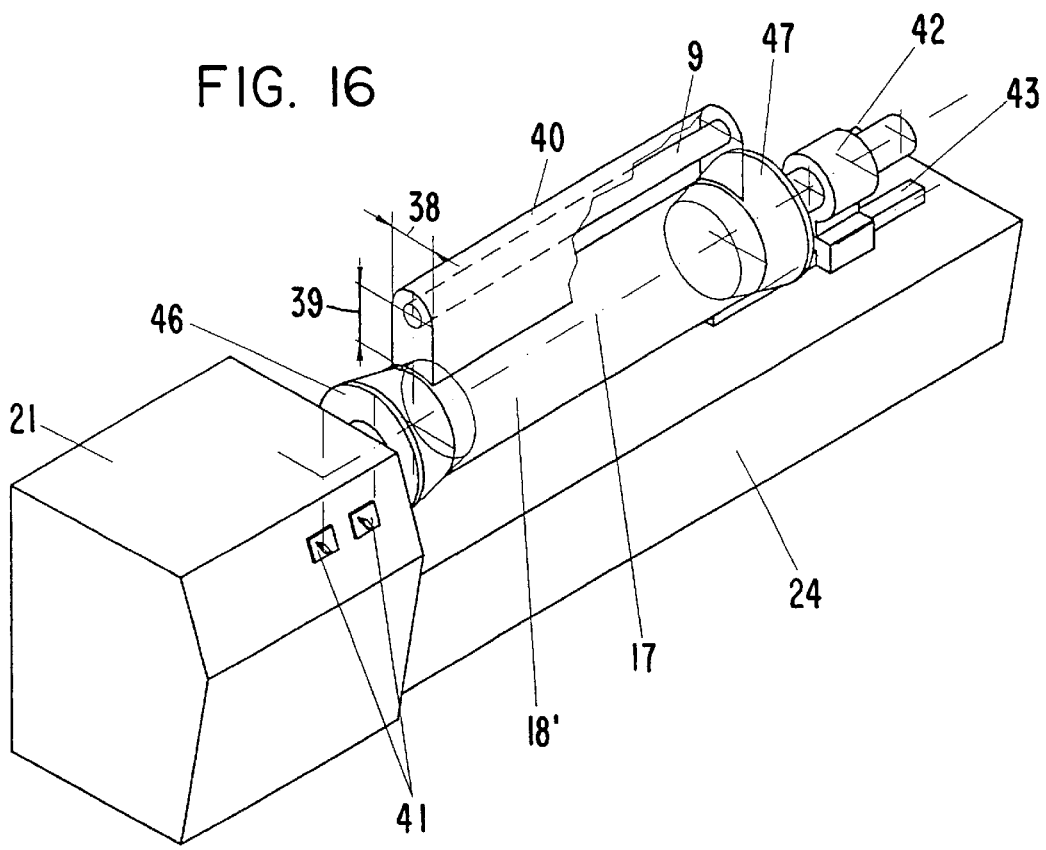
FIG. 16 shows a device for the large-area exposure of the blank.

Following the removal of the covering layer 5, in accordance with the pattern, by means of laser radiation, in order to construct the irradiation mask 5', there follows the large-area exposure, carried out by a lamp 9 on an exposure device, which is illustrated schematically in FIG. 16. In this case, the lamp 9 has the form of a lamp bar with a circular crosssection and extends over the entire length of the screen-printing stencil 18'. Although a xenon vapour lamp, inter alia, can also be used as the lamp 9, a metal halogen vapour lamp is advantageous from the point of view of its energy balance, if the photoresist used is sensitive in the UV range, since its energy balance is better, as has already been explained above.

The width 38 of the lamp housing 40 and the distance 39 of the lamp 9 from the surface of the screen-printing stencil 18' have the influence, already described during the explanation of the exposure device shown in FIG. 7, on the exposure time and fidelity of contour, and are selected accordingly. Apart from the drive cone 46 and the centering cone 47 for the mounting of the screen-printing stencil 18', the exposure device according to FIG. 16 is constructed in just the same way as the exposure device described using FIG. 7, so that a renewed description is dispensed with here.

Figure 17:
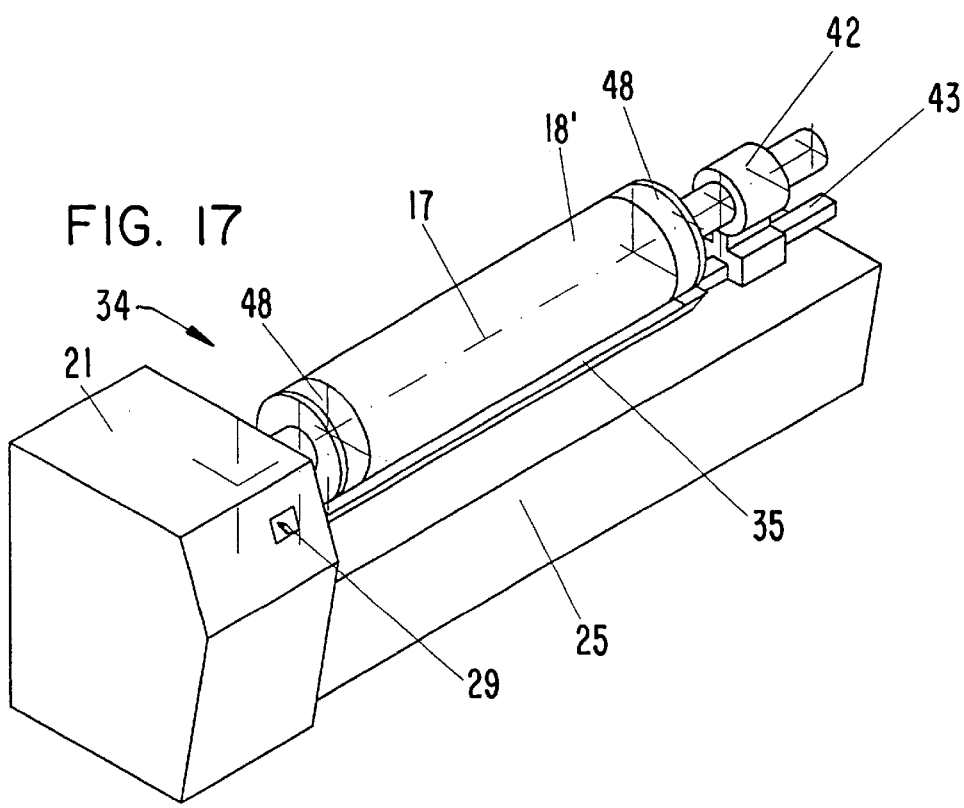
FIG. 17 shows a device for developing the blank following the exposure.

Following the large-area exposure, the development of the photoresist layer 4' is performed on a developing device 34, which is illustrated in FIG. 17 and, apart from the bearing for the screen-printing stencil 18', corresponds to the developing device 34 illustrated in FIG. 6.

Photoresist layers based on diazo resin are, in particular, mostly developed with the aid of an aqueous alkaline solution (about 2% soda and, if appropriate, small quantities of sodium hydroxide or potassium hydroxide solution). For this operation, the screen-printing stencil 18' rotates very slowly on the developing device 34, while its surface dips into a tray 35 which contains the liquid developer. The screen-printing stencil 18' is in this case driven via an internal chuck 48 assigned to the headstock 21, while the other end of the screen-printing stencil 18' is supported by an internal chuck 48 held in the supporting bearing 42.

For this development, a time expenditure of a few minutes is generally necessary. After the development has been completed, depending on the type of the resist used (positive or negative resist), the exposed or unexposed places of the photoresist layer 6 are removed. Following the development, washing with water is carried out, in order to remove all the residues of the developer.

If a crosslinking resist, for example made of epoxy resin, gelatin or polyvinyl alcohol base, was used for the photoresist layer 4', then the development of the photoresist layer 4' is carried out simply by rinsing with warm or hot water. The screen-printing stencil 18' is rinsed off, using a hand shower, over an intersection trough for the waste water having resin residues.

Although only the production of cylindrical printing formes has been shown and explained using the drawing, the process according to the invention can also be used in the case of flat printing plates.

In the case of plate-like printing formes, the structuring of the covering layer 5, that is to say the exposure or irradiation of the second radiation-sensitive layer, can in this case be carried out using an exposure head which can be displaced over the printing plate in two directions, preferably at right angles to each other.

What is claimed is:

1. A method for producing a printing form, comprising the steps of:
applying a first radiation-sensitive layer on a carrier;
applying a covering layer containing at least one of fine light-absorbing particles, fine light-reflecting particles, black carbon, fine metal particles, pigments, and radiation-absorbing chemicals to said first radiation-sensitive layer;
applying a structuring mask to said covering layer, wherein the step of applying the structuring mask includes
applying a second radiation-sensitive layer to said covering layer,
irradiating said second radiation-sensitive layer in accordance with a predetermined pattern, and
developing said second radiation-sensitive layer after the step of irradiating said second radiation-sensitive layer for structuring said structuring mask in accordance with said predetermined pattern; and structuring said covering layer using said structuring mask, wherein the step of structuring said covering layer includes
removing uncovered portions of said covering layer in order to form a radiation mask in accordance with said predetermined pattern,
irradiating said first radiation-sensitive layer, and
developing said first radiation-sensitive layer.

2. The method according to claim 1, wherein said step of developing said second radiation-sensitive layer includes removing said covering layer in accordance with said predetermined pattern.

3. The method according to claim 1, wherein the step of removing uncovered portions of said covering layer includes a step of removing the uncovered portions by one of a mechanical and chemical process.

4. The method according to claim 1, wherein the step of removing portions of said covering layer comprises a step of removing said portions by a mechanical process in accordance with said predetermined pattern.

5. The method according to claim 1, wherein the step of removing portions of said covering layer comprises a step of removing said portions by radiation in accordance with said predetermined pattern.

6. The method according to claim 5, wherein the step of removing portions of said covering layer by radiation comprises a step of removing said portions by electromagnetic radiation in accordance with said predetermined pattern, said electromagnetic radiation including one of heat radiation and light.

7. The method according to claim 5, wherein the step of removing portions of said covering layer by radiation comprises a step of removing said portions by laser radiation in accordance with said predetermined pattern.

8. The method according to claim 5, wherein the step of irradiating said second radiation-sensitive layer comprises a step of irradiating said second radiation-sensitive layer in a point by point fashion.

9. The method according to claim 8, wherein the step of irradiating said second radiation-sensitive layer in a point by point fashion comprises a step of simultaneously irradiating said second radiation-sensitive layer with a plurality of pattern points disposed adjacent to each other.

10. The method according to claim 1, wherein the step of applying said covering layer comprises a step of applying a covering layer containing radiation-absorbing materials or pigments which are part of a wax solution.

11. The method according to claim 1, wherein the step of applying said covering layer comprises a step of applying a covering layer containing fine light-absorbing or light-reflecting particles which are suspended in a gelatin or polyvinyl alcohol.

12. The method according to claim 11, wherein the step of applying said covering layer comprises a step of applying a covering layer containing fine light-absorbing or light-reflecting particles which are suspended in a gelatin, said particles are metals, said metals being produced by a reduction of silver halides dissolved in said gelatin.

13. The method according to claim 1, wherein the step of applying said covering layer comprises a step of applying the covering layer by immersion coating.

14. The method according to claim 1, wherein the step of applying said covering layer comprises a step of applying said covering layer having a thickness generally between 1 and 20 micrometers.

15. The method according to claim 14, wherein the step of applying said covering layer comprises a step of applying said covering layer having a thickness generally 7 and 14 micrometers.

16. The method according to claim 15, wherein the step of applying said covering layer comprises a step of applying said covering layer having a thickness generally of 10 micrometers.

17. The method according to claim 1, wherein the step of applying said radiation-sensitive layer comprises a step of applying a photopolymer layer having a thickness generally between 1 and 10 millimeters.

18. The method according to claim 1, wherein the step of applying said radiation-sensitive layer comprises a step of applying a photopolymer layer having a thickness generally between 2 and 5 millimeters.

19. The method according to claim 1, wherein the step of applying said radiation-sensitive layer comprises a step of applying a photoresist layer by immersion coating.

20. The method according to claim 19, wherein the step applying said photoresist layer comprises a step of applying a photoresist layer being made of one of synthetic resin, epoxy resin, polyester resin, and methyl methacrylate resin.

21. The method according to claim 19, wherein the step of applying said photoresist layer comprises a step of applying a photoresist layer having elastic properties.

22. The method according to claim 1, wherein the step of applying said radiation-sensitive layer on a carrier comprises a step of applying said radiation-sensitive layer on a carrier having a closed surface.

23. The method according to claim 1, wherein the step of applying said radiation-sensitive layer on a carrier comprises a step of applying said radiation-sensitive layer on a substantially planar carrier.

24. The method according to claim 1, wherein the step of applying said radiation-sensitive layer on a carrier comprises a step of applying said radiation-sensitive layer on a substantially cylindrical carrier.

25. A method for producing a printing form, comprising the steps of:
applying a radiation-sensitive layer on a carrier;
applying a covering layer on to said radiation-sensitive layer;
spraying a structuring mask onto said covering layer in a point by point fashion in accordance with a predetermined pattern;

structuring said covering layer using said structuring mask in order to form a radiation mask;

irradiating said radiation-sensitive layer; and developing said radiation-sensitive layer.

26. The method according to claim 25, wherein said step of spraying a structuring mask includes a step of spraying wax onto said covering layer in a point by point fashion in accordance with the predetermined pattern; and said step of structuring said covering layer using said structuring mask in order to form the radiation mask includes removing uncovered parts of said covering layer by an etching process.

27. The method according to claim 25, wherein the step of applying a radiation-sensitive layer includes applying a photoresist radiation-sensitive layer on the carrier by immersion coating, the photoresist layer made of one of gelatin and polyvinyl alcohol, and having a photosensitive tanning agent.

28. A method for producing a printing form, comprising the steps of:

applying a first radiation-sensitive layer on a carrier;

applying a covering layer to said first radiation-sensitive layer;

applying a structuring mask to said covering layer, wherein said step of applying said structuring mask includes applying a second radiation-sensitive layer to said covering layer, irradiating said second radiation-sensitive layer in accordance with a predetermined pattern, and developing said second radiation-sensitive layer after the step of irradiating said second radiation-sensitive layer for structuring said structuring mask in accordance with said predetermined pattern; and structuring said covering layer using said structuring mask, wherein said step of structuring said covering layer includes removing uncovered portions of said covering layer in order to form a radiation mask in accordance with said predetermined pattern, irradiating said first radiation-sensitive layer, and developing said first radiation-sensitive layer.

29. The method according to claim 28, wherein the removing step comprises a step of removing portions of said covering layer during the development of said second radiation-sensitive layer.

30. The method according to claim 28, wherein the steps of applying said first and second radiation-sensitive layers comprises a step of applying a first radiation sensitive layer having a radiation-sensitive range different from said second radiation-sensitive layer.

31. The method according to claim 28, wherein the step of applying said second radiation-sensitive layer comprises a step of applying a photoresist, said photoresist being sensitive to visible light radiation.

32. The method according to claim 31, wherein the step of applying said photoresist comprises a step of applying a photoresist, said photoresist being decomposable by light.

33. The method according to claim 28, wherein the step of applying said second radiation-sensitive layer comprises a step of applying said second radiation-sensitive layer having a thickness generally between 1 and 20 micrometers.

34. The method according to claim 33, wherein the step of applying said second radiation-sensitive layer comprises a step of applying said second radiation-sensitive layer having a thickness generally between 7 and 14 micrometers.

35. The method according to claim 34, wherein the step of applying said second radiation-sensitive layer comprises a step of applying said second radiation-sensitive layer having a thickness generally of 10 micrometers.

36. The method according to claim 28, wherein the step of applying said covering layer comprises a step of applying a covering layer capable of absorbing radiation in a radiation sensitivity range of said second radiation-sensitive layer.

37. The method according to claim 28, wherein the step of irradiating said second radiation-sensitive layer comprises a step of irradiating said second radiation-sensitive layer with a laser light source, said laser light source emitting laser light in a blue range of a visible spectrum.

38. A method for producing a printing form, comprising the steps of:

applying a radiation-sensitive layer on a carrier;

applying a covering layer to said radiation-sensitive layer;

applying a structuring mask to said covering layer, said structuring mask being structured in accordance with a predetermined pattern;

structuring said covering layer using said structuring mask in order to form a radiation mask in accordance with said predetermined pattern;

irradiating said radiation-sensitive layer; and developing said radiation-sensitive layer, wherein the step of applying said radiation-sensitive layer on a carrier comprises a step of applying said radiation-sensitive layer on a screen carrier having openings therein.

39. A method for producing a printing form, comprising the steps of:

applying a radiation-sensitive layer on a carrier;

applying a covering layer to said radiation-sensitive layer;

applying a structuring mask to said covering layer, said structuring mask being structured in accordance with a predetermined pattern;

structuring said covering layer using said structuring mask in order to form a radiation mask in accordance with said predetermined pattern;

irradiating said radiation-sensitive layer; and developing said radiation-sensitive layer, wherein the step of applying said radiation-sensitive layer on a carrier comprises a step of applying said radiation-sensitive layer on a metal carrier.

40. A method for producing a printing form, comprising the steps of:

applying a radiation-sensitive layer on a textile fabric carrier, said carrier being reinforced by deposition of metal;

applying a covering layer to said radiation-sensitive layer;

structuring said covering layer in accordance with a predetermined pattern in order to form a radiation mask;

irradiating said radiation-sensitive layer; and developing said radiation-sensitive layer.

* * * * *